US006381333B1

(12) United States Patent
Suzuki

(10) Patent No.: US 6,381,333 B1
(45) Date of Patent: Apr. 30, 2002

(54) SOUND PROCESSING CIRCUIT

(75) Inventor: Tatsuya Suzuki, Katano (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/008,017

(22) Filed: Jan. 16, 1998

(30) Foreign Application Priority Data

Jan. 20, 1997 (JP) ........................................ 9-007185

(51) Int. Cl.[7] ........................ H04R 5/00; H04B 3/00; H03G 5/00

(52) U.S. Cl. ........................ 381/18; 381/80; 381/98

(58) Field of Search ........................ 381/98–99, 80, 381/18–23

(56) References Cited

U.S. PATENT DOCUMENTS 5,912,976 A * 6/1999 Klayman et al. ............ 381/18
6,240,189 B1 * 5/2001 Aylward ..................... 381/18

OTHER PUBLICATIONS

Masaaki Fuseki, "Dolby Surround and Pro Logic," JAS Journal, May 1989, pp. 22–26, (partial English translation attached).

* cited by examiner

*Primary Examiner*—Forester W. Isen
*Assistant Examiner*—Elizabeth McChesney
(74) *Attorney, Agent, or Firm*—Ratner & Prestia

(57) ABSTRACT

A sound processing circuit for distributing low frequency signal components of multichannel audio signals. The sound processing circuit filters low frequency signal components from the digital audio signals of m (m≦n) specified channels using an exclusive channel having low frequency signals and n (n>1) multiple independent channels, and outputs the filtered low frequency signal components as part of a low frequency signal channel. The sound processor circuit comprises m high-pass filters to receive digital audio signals from m of specified channels, and allows the signal components having a frequency higher than a cut-off frequency fc to pass; m first coefficient multipliers receive the digital audio signals of the m of specified channels and multiply the signals by a multiplication coefficient ai (0<ai<1); a second coefficient multiplier receives the digital audio signal of the exclusive channel, and multiplies the signal by a multiplication coefficient aL (0<aL<1); an adder for adding each output of the m first coefficient multipliers and the output of the second coefficient multiplier to produce a synthetic audio signal; and a low pass filter which receives the synthetic audio signal from the adder, and allows the signal components having a frequency lower than the cut-off frequency fc to pass.

25 Claims, 7 Drawing Sheets

SOUND PROCESSING CIRCUIT

FIELD OF THE INVENTION

The present invention relates to the field of sound processing circuits which handle low frequency signal components in multichannel audio signals.

BACKGROUND OF THE INVENTION

With recent progress in audio signal compression technology and faster signal processing, recording and reproduction of multichannel audio signals, which have more channels than the conventional two channel stereo signals, are now being adopted in commercial equipment. Typical multichannel systems include the AC-3 system developed by Dolby Laboratories (hereafter referred to as the discrete digital multichannel system) and MPEG2. Optical disks on which audio signals are recorded employing the discrete digital multichannel system are already on the market. Decoders for converting signals recorded in the discrete digital multichannel format into ordinary signals are also available. Furthermore, at the end of 1996, software and hardware for digital video disks adopting the discrete digital multichannel system as one audio recording format were released.

The characteristics of these multichannel audio signal recording systems are (1) Audio signals for each channel can be recorded as completely independent audio signals without any correlation between channels and (2) Audio signals of a broad frequency band ranging from low frequency to high frequency, limited only by sampling frequency, can be recorded in each channel. For example, in the discrete digital multichannel system, there are five independent channels with frequency bands from 20 Hz to 20 kHz, and one channel exclusive to low frequencies up to 120 Hz.

The conventional processing method used in commercial equipment is to first encode the above multichannel audio signals and record them as 2-channel stereo signals. These stereo signals can be decoded during reproduction to reconstitute multichannel audio signals. The Dolby surround system adopts this method. This system is most frequently used for recording multichannel audio signals in movies.

The chief characteristic of this method is its feasibility to record and reproduce multichannel audio signals in a format completely compatible with two-channel stereo signals. Using this method, however, the signals in each discrete channel lose their independence since signals are produced for each channel by signal processing such as the addition and subtraction of the stereo signals recorded on the recording medium. This converts previously independent multichannel audio signals, before encoding, into completely different signals.

To reduce the above disadvantage, an active matrix circuit called the Dolby ProLogic circuit has been developed. This circuit secures the independence of each channel by reducing the sound level of the other channels when signal components of a certain channel are dominant in multichannel audio signals processed by the addition and subtraction of stereo signals, and reproducing the signals only in the dominant channel. This circuit is effective when only one channel is dominant, but much less efficient when all channels have about the same signal level.

New multichannel systems including the discrete digital multichannel system completely assure the independence of each channel during recording in the conventional two-channel stereo signal format. These new multichannel systems are used mainly for recording and reproducing sound in movies. Assurance of independence of each channel improves the clarity of spoken word, movement and direction of sound and spatial impression, allowing viewers an enhanced impression of live sound performance.

For reproducing these multichannel audio signals, speakers which can cover a broad range of frequency bands from low to high bands are preferably used. In the above active matrix system, for example, audio signals of four channels at the left, center, right and rear are decoded from input stereo signals. Audio signals for the rear channel have a frequency range from about 100 Hz to 7 kHz, and audio signals of other three channels at the left, center, and right have a broad frequency range from 20 Hz to 20 kHz.

Accordingly, it is preferable to employ the same type of speaker for at least three channels, i.e. at the left, center, and right, for covering the frequency range from 20 Hz to 20 kHz. In the above discrete digital multichannel system, it is preferable to employ speakers to cover the frequency range of 20 Hz to 20 kHz for all five channels, i.e., at the left, center, right, left back, and right back, because the signals for all five channels range from 20 Hz to 20 kHz.

However, if this type of reproduction system is introduced for home use, a large speaker for broad reproduction bands can be employed for the left and right speakers but it is generally difficult to use this type of speaker in the center because there is a display monitor for displaying video images. Also for back speakers, smaller speakers are often used due to limitations in installation space. These smaller speakers generally have less reproduction capability for low frequencies compared to large speakers.

When multichannel audio signals are reproduced in unmodified form in a system employing speakers with both good and poor low frequency reproducibility, the relative volumes of low and high frequencies may be unbalanced. The volume of low frequency sound may be insufficient if audio signals are concentrated in channels with poor low-band reproducibility. In particular, listeners may have a sense of incongruity when the sound moves from one side to the other.

To reduce these disadvantages, equipment exists which features an active matrix circuit which further employs a sound processing circuit for distributing low frequency signal components of the center channel to the left and right channels.

FIG. 7 shows an example of a sound processing circuit of the active matrix system. Audio signals input from two channels to an active matrix circuit 51 are decoded into signals for four channels: left (Lch), center (Cch), right (Rch), and back (Sch). A high-pass filter (HPF) 52 receives decoded signals for the center channel, allows through only high-band signals, and outputs them as signals for the center channel.

At the same time, signals for the center channel are input to a low-pass filter (LPF) 53. The cut-off frequency of the LPF 53 is set at almost equivalent to the cut-off frequency of the HPF 52, and it allows through only low frequency signals for the center channel. The output here is attenuated by about 3 dB by a coefficient multiplier 54, and then supplied to adders 55L and 55R for the left and right channels. The adder 55L adds the low frequency signal components of the center channel to the audio signals for the left channel, and the adder 55R adds the low frequency signal components of the center channel to the audio signals for the right channel. Consequently, these low frequency signal components are distributed to the left and right channels by the two adders 55L and 55R. The cut-off frequencies for the HPF 52 and LPF 53 are both set to about 100 Hz.

The above sound processing circuit enables the diversion of low frequency signals, originally destined for the center channel, to the left and right speakers and avoids insufficient low frequency signal components even when the center channel speaker has poor low frequency reproducibility. It is difficult to specify the position of sound source of frequency signal components lower than 100 Hz which are distributed to the left and right channels. This avoids a sense of incongruousness as to sound source direction even though the sound source is split between the left and right channels.

The active matrix circuit 51 suppresses the supply of audio signals to the center and right channels when the left channel receives large audio signals. On the other hand, when the center channel receives a large portion of audio signals, the active matrix circuit 51 suppresses the supply of audio signals to the right and left channels. This makes it unnecessary to set a surplus amplitude margin to avoid overflow of audio signals in the adders 55L and 55R which distribute the low frequency signal components for the center channel to the left and right channels.

Accordingly, the adder for distributing low frequency signal components for the center channel to the left and right channels may not require a surplus amplitude margin even when the circuit is configured using digital processing. This avoids the dropping of lower bits for securing sufficient amplitude margin. In other words, the sound processing circuit can be replaced with a digital circuit without degrading the sound quality.

In this example, configuration of the circuit is simple since it involves only distributing low frequency signal components for the center channel to the left and right channels, and therefore it is relatively easy to configure using an analog circuit. The technology employed in the active matrix circuit is further explained in detail in a range of documents such as JAS Journal (pp. 22–26, May 1989).

In case of the aforementioned new discrete digital multichannel recording and reproducing system which allows the recording of audio signals completely independently to multiple channels, the situation is slightly different.

First, since the signals for each channel are independent, the amplitude increases in response to the number of added signal components in the circuits downstream from the adder when low frequency signal components from a certain channel are distributed to other channel(s). Therefore, it is necessary to provide a surplus amplitude margin for these circuits. For example, if the low frequency signal components of a certain channel are distributed to another channel and low frequency signals for both channels have the maximum amplitude at the same phase and same level, a surplus amplitude margin of about 6 dB may be necessary in circuits downstream from the adder. If there is no such surplus amplitude margin, a 6 dB signal overflow is created in the circuits downstream from the adder.

Second, since all channels can cover signal components in broad frequency bands from low to high frequency bands, the number of channels to which low frequency signal components can be distributed increases. Accordingly, added amplitude may be converted into high-level signals. For example, if low frequency signal components for all six channels are added in equipment adopting the discrete digital multichannel system, added signals will have 6 times greater amplitude, at their peak, than the original signals. If the original signals in each channel are at 2 Vrms at the maximum, their added signals may reach 12 Vrms at their peak.

Third, an extremely complicated circuit for distributing low frequency signal components may be required to determine which low frequency signal components from which channel are to be distributed to which channel.

As described above, a sound processing circuit for distributing low frequency signal components for a certain channel to other channel(s) can be relatively easily configured by the use of a digital circuit, and its control may be facilitated. However, a large amplitude margin may be required for channels receiving distributed low frequency signal components. To secure such a large amplitude margin, the upper bits in digital signals are given priority in the sound processing circuit, resulting in the risk of lower bits in digital audio signals being dropped. The dropping of lower bits from digital audio signals may lead to degradation of sound quality.

If a sound processing circuit having the above function is configured with an analog circuit, it is relatively easy to secure an amplitude margin in channels receiving distributed low frequency signals. However, the circuit configuration may become complicated by the need to determine the distribution of low frequency signal components, and thus its control method may become more complicated.

Moreover, ordinary amplifiers which are connected downstream from the sound processing circuit often do not have any surplus amplitude margin. Overflow may occur in devices in downstream processes although overflow has not occurred in the sound processing circuit.

To avoid overload in downstream devices, an effective strategy is to provide a limiter to circuits through which audio signals pass. If the limiter is configured with an analog circuit, it results in the addition of another circuit, adding to overall circuit cost. The burden on the analog circuit may also increase because a large amplitude margin may be required for signals to be supplied to the limiter.

Furthermore, with recent improvements in the performance of digital processors, spare processing capability in digital circuitry may be utilized for configuring the limiter. This allows the configuration of the limiter without increasing the cost. The maximum amplitude of the limiter, however, is restricted if there is an analog circuit based signal level adjuster. Since the signal level adjuster adjusts signal levels, the maximum level of amplitude changes depends on the maximum amplitude of the signal level adjuster.

For example, if the restriction level of the limiter is set according to the 0 dB attenuation level of the signal level adjuster, the maximum level of the signal level adjuster may fall by 10 dB when the attenuation level of the signal level adjuster is set to −10 dB compared to when the attenuation level of the signal level adjuster is 0 dB. Therefore, the amplitude of the output of the signal level adjuster may be unnecessarily limited if the attenuation level in the limiter is set too high.

SUMMARY OF THE INVENTION

The present invention provides a sound processing circuit which may solve a range of problems related to the distribution of low frequency signal components as a result of the introduction of the aforementioned new multichannel recording and reproduction systems.

The sound processing circuit of the present invention filters the low frequency signal components in digital audio signals of m ($m \leqq n$) channels out of one exclusive channel for low frequency signals and n ($n>1$) multiple independent channels, and outputs filtered low frequency signal components from a low frequency signal channel. The sound processing circuit of the present invention comprises m high-pass filters which receive m digital audio signals from the m specified channels, and allow to pass through signal components in higher bands than a cut-off frequency fc; m first coefficient multipliers which receive and multiply digital audio signals of the m specified channels by a multiplication coefficient ai (0<ai<1); a second coefficient multiplier which receives and multiplies the digital audio signals of the low frequency signals of the exclusive channel, by a multiplication coefficient aL (0<aL<1); an adder for adding each output of m first coefficient multipliers and the output of a second coefficient multiplier to produce synthetic audio signals; and a low pass filter which receives the synthetic audio signals from the adder, and allows to pass through signal components in lower bands than the cut-off frequency fc.

In the above configuration, low frequency signal components are filtered from input multichannel audio signals by a digital unit, and filtered low frequency signal components are distributed by an analog unit.

Using the above configuration, most of the complicated circuits required for distributing low frequency signal components in multichannel audio signals can be realized with digital circuits which facilitate configuration and control. In addition, a process for adding low frequency signal components to channels to which low frequency signal components are distributed can be realized with analog circuits which facilitate the assurance of an amplitude margin. This facilitates configuration and control of hardware while maintaining good sound quality by securing a sufficient amplitude margin.

DESCRIPTION OF THE PREFERRED EMBODIMENTS

A sound processing circuit of exemplary embodiments of the present invention is explained next with reference to drawings. In the following explanation, the sound processing circuit for multichannel audio signals output from decoders employing the discrete digital multichannel system, one of recording and reproduction systems for multichannel audio signals presently commercialized, is explained.

In the discrete digital multichannel system, there are six channels for multichannel audio signals: left channel (Lch), center channel (Cch), right cannel (Rch), left back channel (LSch), right back channel (RSch), and low frequency channel (LFE). The frequency bands of the LFE channel are about 120 Hz or less, and the other five channels have frequency bands between about 20 Hz and about 20 kHz.

First exemplary embodiment

Figure 1:
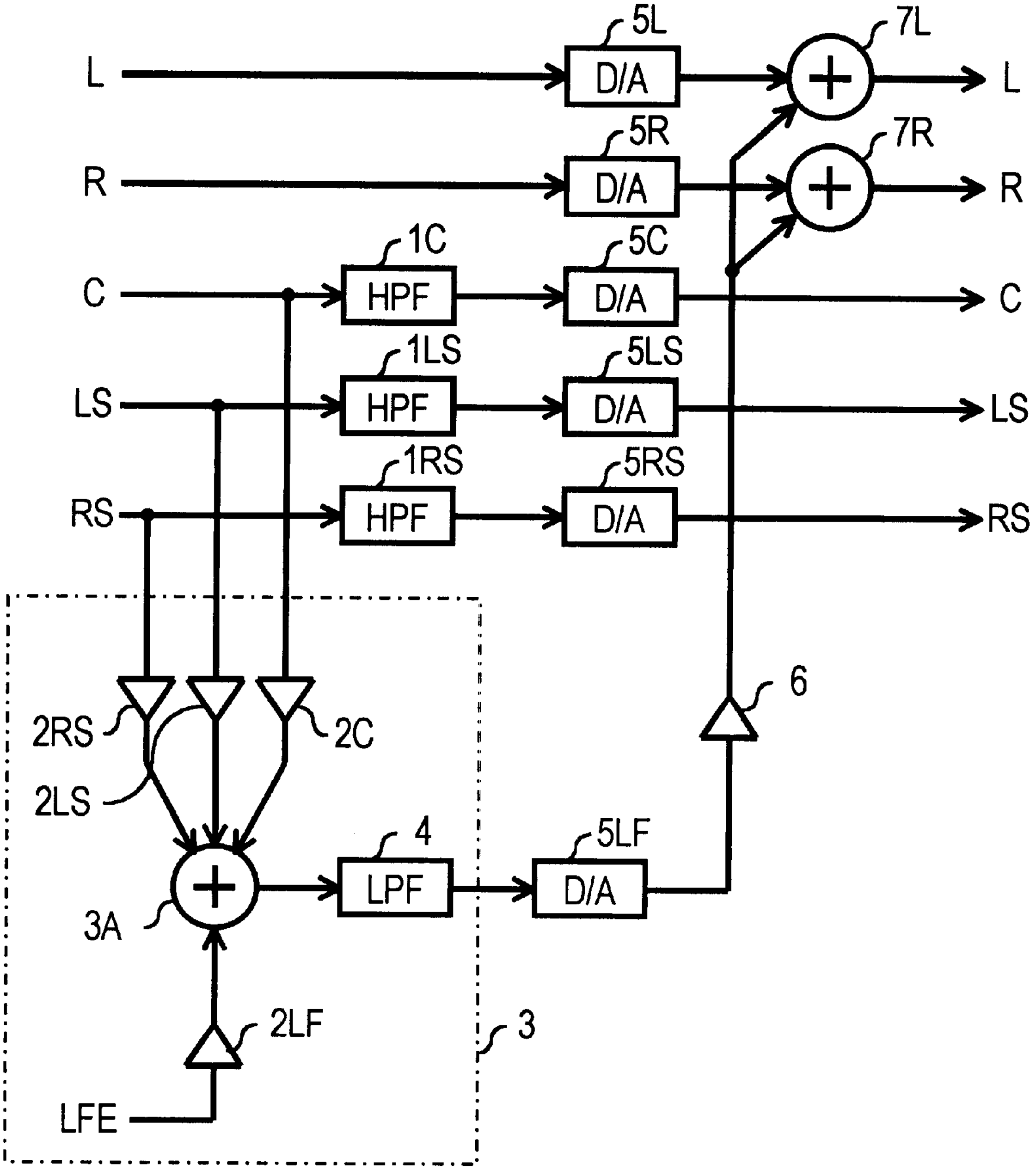
FIG. 1 is a block diagram of a configuration of a sound processing circuit in accordance with a first exemplary embodiment of the present invention.

FIG. 1 shows a configuration of a sound processing circuit in a first exemplary embodiment of the present invention. In this exemplary embodiment, there are n (here, n=5) independent channels and one exclusive channel for low frequency signals. A speaker with a high reproduction capability for low frequency signals is connected to an output unit of each Lch and Rch. A speaker with a low reproduction capability for low frequency signals is connected to each By output unit of m (here, m=3) independent channels, i.e. Cch, LSch, and RSch. Therefore, the function of the sound processing circuit of this exemplary embodiment is to distribute low frequency signal components of the Cch, LSch, and RSch and bass sound of the LFE to the Lch and Rch.

In FIG. 1, digital audio signals of Lch and Rch are input to respective first digital-to-analog converters (hereafter referred to as D/A converters) 5L and 5R, and converted to analog audio signals. Digital audio signals of Cch, LSch, and RSch are input to respective high-pass filters (HPF) 1C, 1LS, and 1RS for removing low frequency signal components, and then audio signals of high frequency signal components are input to second D/A converters 5C, 5LS, and 5RS to be converted into analog audio signals. A cut-off frequency fc of the HPFs 1C, 1LS, and 1RS are about 100 Hz.

A low frequency signal component synthesizer 3 is provided in the sound processing circuit for synthesizing low frequency signal components in audio signals of Cch, LSch and RSch. In FIG. 1, the low frequency signal component synthesizer 3 comprises first coefficient multipliers 2C, 2LS, and 2RS which receives audio signals of the Cch, LSch, and RSch, a second coefficient multiplier 2LF which receives the LFE audio signals, a first adder 3A for adding the output signals of the first and second coefficient multipliers, and a low-pass filter (LPF) 4 for allowing the low frequency signal components of the output signal of the first adder 3A to pass.

Digital audio signals output from the low frequency signal components synthesizer 3 are converted into analog audio signals by a third D/A converter 5LF, multiplied by a specified multiplication coefficient by a third coefficient multiplier 6, and then input to second adders 7L and 7R. The second adder 7L is an analog adder for adding the output of the first D/A converter 5L and the output of the third coefficient multiplier 6. Similarly, the second adder 7R is an analog adder for adding the output of the first D/A converter 5R and the output of the third coefficient multiplier 6.

A multiplication coefficient ai (0<ai<1) for the first coefficient multipliers 2C, 2LS, and 2RS, and a multiplication coefficient aL (0<aL<1) for the second multiplier 2LF are, for example, ¼; and a multiplication coefficient b for the third coefficient multiplier 6 is 4 or 4$\alpha$. A value of $\alpha$ is set to about 0.7 in the case of the active matrix circuit. However, in this exemplary embodiment, the value of $\alpha$ is preferably set based on actual reproduction tests because the value largely depends on the number of channels to which audio signals are distributed as well as applicable reproduction equipment and frequency bands.

The multiplication coefficient for each coefficient multiplier is generally set as follows. Specifically, the multiplication coefficient ai and aL of the first coefficient multipliers 2C, 2LS, and 2RS, and the second coefficient multiplier 2LF is set to a value which attenuates each signal level to about one quarter (¼) or less for preventing overflow in the first adder 3A because signals of these four channels are added in the first adder 3A. The multiplication coefficient b for the third coefficient multiplier 6 is set to a value to put back the signal levels attenuated by the first coefficient multipliers 2C, 2LS, and 2RS, and the second coefficient multiplier 2LF to their original levels. However, since filtered low frequency signal components will be distributed to the Lch and Rch channels, the multiplication coefficient b of the third coefficient multiplier 6 is corrected by a spatial addition correction factor α with consideration to spatial additional sound effects after signals are output from the speakers as sound.

The operation of the sound processing circuit in the first exemplary embodiment of the present invention, as configured above, is explained next. In FIG. 1, HPFs 1C, 1LS, and 1RS filter out low frequency signal components from input audio signals of Cch, LSch, and RSch, and the high frequency signal components of the audio signals are output from each HPF. On the other hand, the Cch, LSch, and RSch audio signals containing low frequency signal components are input to respective first coefficient multipliers 2C, 2LS, and 2RS, and their amplitude is attenuated to about ¼. The LFE audio signals, consisting of low frequency signal components of about 120 Hz or below, are input to the second coefficient multiplier 2LF, and their amplitude is also attenuated to about ¼.

The first adder 3A adds the Cch, LSch, and RSch and LFE audio signals, which are attenuated to ¼, and produces synthetic audio signals. Even if audio signals of these four channels have the maximum amplitude and the same phase, the amplitude of the synthetic audio signals can be suppressed within an input range of the digital circuit system. The LPF 4 receives the synthetic audio signals, and allows through only low frequency signals of about 100 Hz or below.

Low frequency synthetic audio signals are converted to analog synthetic audio signals by the third D/A converter 5LF, and amplified 4α times by the third coefficient multiplier 6. Circuits downstream from this process are configured with analog circuits, and therefore a margin for the level of audio signals is sufficiently secured. For example, even when the maximum level of signals is 2 Vrms, the supply voltage of the analog circuits is designed to be sufficiently larger than this level so that they do not saturate even if signals above 2 Vrms are input. In addition, the possibility that the four channels audio signals, Cch, LSch, RSch, and LFE, have the maximum amplitude in the same phase for the low frequency signal components is low. Listeners have little awareness toward localization of bass sound. For example, when designing sound source, extra bass sound and bass sound are often inserted to LFE or either LFE or a front channel instead of inserting such sound into all channels.

Digital audio signals of the Lch are converted into analog audio signals by the first D/A converter 5L, and then added with low frequency synthetic audio signals by the second adder 7L. The Rch digital audio signals are converted into analog audio signals by the first D/A converter 5R, and then added with low frequency synthetic audio signals by the second adder 7R. General audio-video (AV) equipment for reproducing video images and sound are equipped with speakers with broad reproduction frequency bands at least at the front. Bass sound added to other channels are output to listeners from the front via these speakers.

The HPFs 1C, 1LS, and 1RS filter out low frequency signal components from digital audio signals of respective Cch, LSch, and RSch, and the digital audio signals are converted into analog audio signals by the second D/A converters 5C, 5LS, and 5RS. These audio signals for middle and high frequencies are reproduced from each speaker for the Cch, LSch, and RSch. Since listeners are conscious of localization of middle to high frequency sound, front and rear speakers are used for producing the middle and high frequency sound with conspicuous localization. When a sound image consisting mainly of middles and highs, spatially moves, its movement can be reproduced with realism. In particular, it avoids a sense of incongruousness caused by reproducing medium and high frequency sound with different sound pressure from each speaker due to the movement of sound image.

As explained above, the sound processing circuit of this exemplary embodiment enables to maintain appropriate balance between the volume of the bass and the high frequency sound reproduced from each speaker although speakers for the Cch, LSch, and RSch have insufficient reproduction capability for low frequency signals.

To prevent overflow of signals in the second adders 7L and 7R, it is desirable to secure a large amplitude margin for the Lch and Rch. This can be relatively easily realized with analog circuits by designing in a large allowance in supply voltage to circuits. In other words, the sound processing circuit of this exemplary embodiment avoids degradation of sound quality by an increase in amplitude which may occur in digital circuits in order to secure a larger amplitude margin by dropping lower bits.

Second exemplary embodiment

Figure 2:
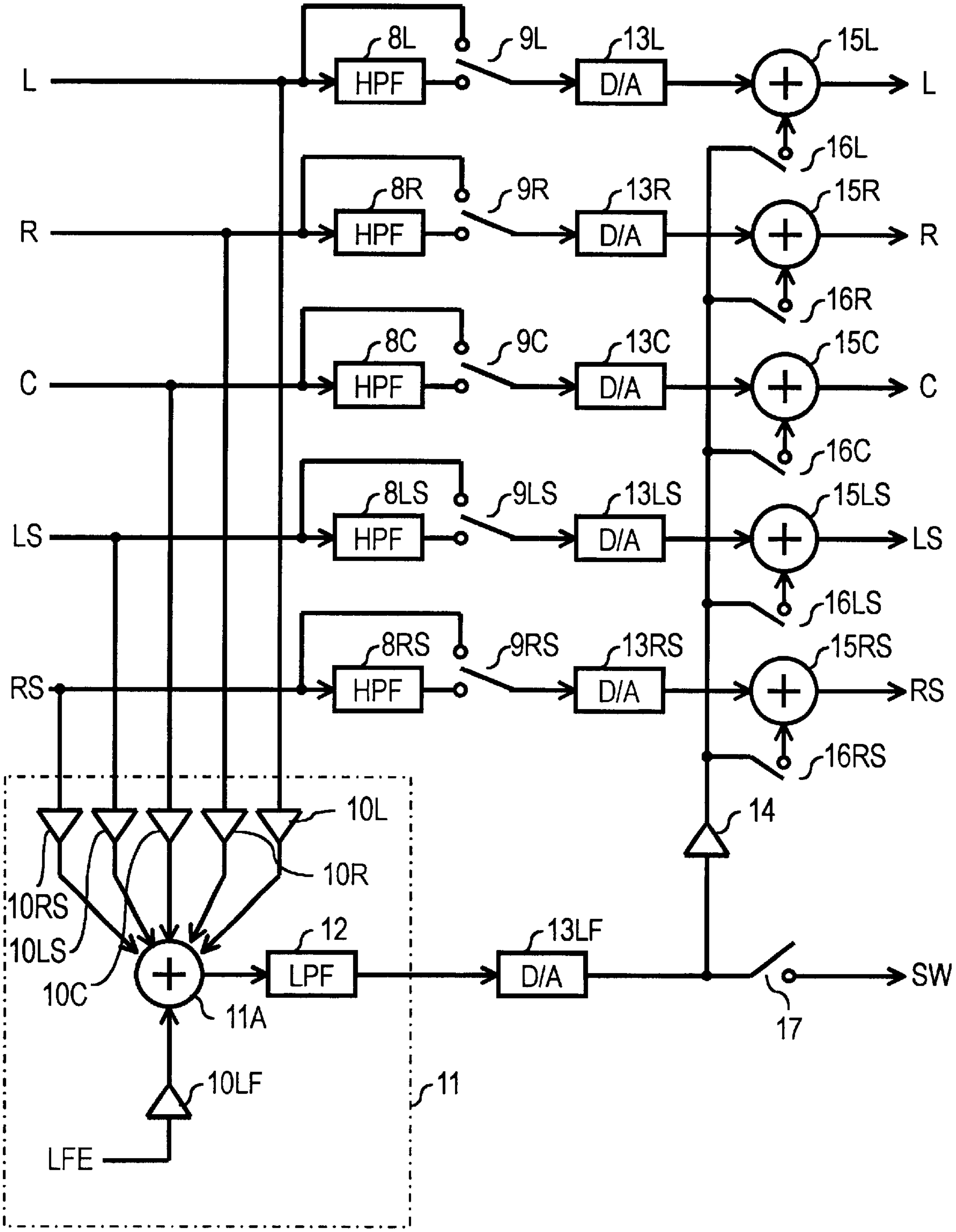
FIG. 2 is a block diagram of another configuration of a sound processing circuit in accordance with the second exemplary embodiment of the present invention.

FIG. 2 shows a configuration of a'sound processing circuit in a second exemplary embodiment of the present invention. A digital unit in the configuration of the sound processing circuit shown in FIG. 1 is relatively simple, and it can also be relatively easily configured with analog circuits. With such sound processing circuit, it may be difficult to finely set which bass sound of which input channel is to be distributed to which output channel in accordance with a user's speaker system.

FIG. 2 shows a block diagram of a sound processing circuit configured in a way to satisfy such user requirements. In this sound processing circuit, the HPF is added to Lch and Rch in addition to the configuration shown in FIG. 1, and a switch is provided to each HPF for freely determining whether to use the HPF.

Digital audio signals of mutually-independent n (here, n=5) channels, i.e., Lch, Rch, Cch, LSch, and RSch, are input to respective HPFs 8L, 8R, 8C, 8LS, and 8RS, and the low frequency signal components are cut off as required. The n switches, i.e., 9L, 9R, 9C, 9LS, and 9RS are provided to respective channels for selecting between audio signals of Lch, Rch, Cch, LSch, and RSch after low frequency signal components are cut off by HPFs 8L to 8RS and audio signals containing low frequency signal components. Respective first D/A converters 13L, 13R, 13C, 13LS, and 13RS receive the selected output of the switches 9L, 9R, 9C, 9LS, and 9RS.

The sound processing circuit of this exemplary embodiment is equipped with a low frequency signal component synthesizer 11 for synthesizing audio signals of Lch, Rch, Cch, LSch, and RSch to output their low frequency signal components. The low frequency signal components synthesizer 11 includes first coefficient multipliers 10L, 10R, 10C, 10LS, and 10RS which receive audio signals of respective Lch, Rch, Cch, LSch, and RSch, a second coefficient multiplier 10LF which receives audio signals of LFE, a first adder 11A for adding output signals of these coefficient multipliers 10L to 10LF, and a LPF 12 for allowing through the low frequency signal components at the output signals of the first adder 11A. The output of the LPF 12 is supplied to a second D/A converter 13LF.

The first D/A converters 13L, 13R, 13C, 13LS, and 13RS are converters for converting digital audio signals, whose frequency bands are selected by the switches 9L, 9R, 9C, 9LS, and 9RS, to analog audio signals. The second adders 15L, 15R, 15C, 15LS, and 15RS receive a respective output from the first D/A converters 13L, 13R, 13C, 13LS, and 13RS. The second D/A converter 13LF is a converter for converting digital low frequency synthetic audio signals output from the LPF 12 to analog audio signals. The output of the second D/A converter 13LF is supplied to a third coefficient multiplier 14 and switch 17.

The cut-off frequency fc of the HPFs 8L, 8R, 8C, 8LS, and 8RS, and LPF 12 is the same as the cut-off frequency of the HPF and LPF shown in FIG. 1. Multiplication coefficients a1, a2, . . . an for the first coefficient multipliers 10L, 10R, 10C, 10LS, and 10RS are set between 0 and 1. If they are not 0, all these coefficients are set to the same value. A multiplication coefficient for the second coefficient multiplier 10LF is set to aL ($0<aL<1$). This value is also set to the same value as ai ($0\leqq i\leqq n$) if it not 0.

If the value of the first coefficient multipliers which are not activated is set to 0, the number of the first coefficient multipliers activated are set to m, and the acoustic spatial additional correction factor is $\alpha$, the multiplication coefficient ai (i is an ordinal between 1 and n) which is not 0 is set to $1/(m+1)$, and the multiplication coefficient of the third coefficient multiplier 14 is set to $(m+1)\ \alpha$. Low frequency synthetic audio signals amplified by the third coefficient multiplier 14 are supplied to the input terminals of switches 16L, 16R, 16C, 16LS, and 16RS.

The switches 16L, 16R, 16C, 16LS, and 16RS are for selecting which channels to output low frequency synthetic audio signals output via the third coefficient multiplier 14, and their output terminals are connected to respective second adders 15L, 15R, 15C, 15LS, and 15RS. The switch 17 is for selecting whether the output low frequency audio signals output from the second D/A converter 13LF to SWch.

As explained above, the first adder 11A is configured to add signals of any channel. Signals of the channels which are input to the first adder 11A can be selected by selecting which first coefficient multipliers 10L, 10R, 10C, 10LS, and 10RS, and the second coefficient multiplier 10LF to be activated by setting either 0 or a value greater than 0 as the multiplication coefficient ai. The switches 16L, 16R, 16C, 16LS, and 16RS also provides freedom to set which channel (s) distribute the filtered low frequency audio signals.

In the sound processing circuit as configured above, switches 9L, 9R, 9C, 9LS, and 9RS, corresponding to a specified set of channels, are connected to the HPF side after determining from which channels filter out the low frequency signal components. The multiplication coefficient ai, for the first coefficient multipliers 10L, 10R, 10C, 10LS, and 10RS which are associated with the channels through which the low frequency signal components is set to other than 0. This enables the low frequency signal components of the audio signals to pass only in the specified channels. Filtered low frequency components can be distributed to specified speakers by connecting the switches 16L, 16R, 16C, 16LS, and 16RS for channels to which the low frequency signal components are to be distributed, to respective second adders 15L, 15R, 15C, 15LS, and 15RS.

Accordingly, low frequency signal components can be finely distributed in accordance with a speaker system of each user. However, if the above configuration is realized with analog circuits; the circuit size may be larger, and exact control may become difficult. Since circuits requiring complicated control in this exemplary embodiment are configured mostly within a digital unit, control of the circuit is much easier than in a circuit consisting entirely of analog circuits. The analog unit downstream from the D/A converters only requires control to the extent of which low frequency signal components are to be distributed to which channel and, thus, it can be easily realized.

Third exemplary embodiment

Figure 3:
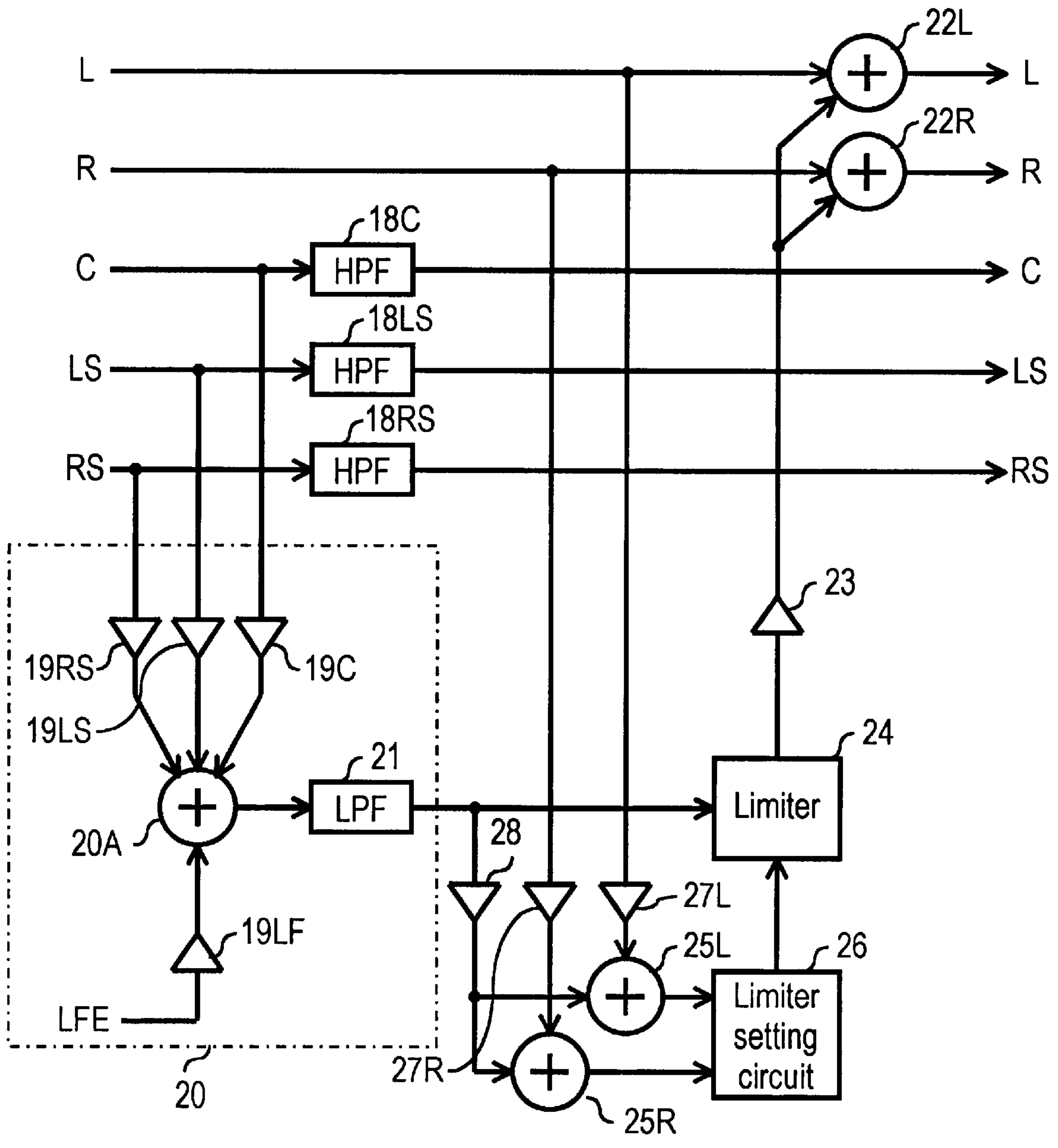
FIG. 3 is a block diagram of a configuration of a sound processing circuit in a third exemplary embodiment of the present invention.

FIG. 3 shows a configuration of the sound processing circuit in a third exemplary embodiment of the present invention. As in the sound processing circuit of the first exemplary embodiment shown in FIG. 1, this exemplary embodiment has n independent channels and one exclusive channel for low frequency signals. Low frequency signal components in m independent channels out of the n independent channels are filtered. The filtered low frequency signal components are then applied to circuit systems for n-m numbers of independent channels.

More specifically, Lch and Rch may be connected to speakers with high reproducibility for low frequency signals, and Cch, LSch, and RSch may be connected to speakers with low reproducibility for low frequency signals. Accordingly, a function of this exemplary embodiment is to distribute low frequency signal components of Cch, LSch, and RSch and audio signals of LFE to Lch and Rch.

In FIG. 3, digital audio signals of Cch, LSch, and RSch are respectively supplied to HPFs 18C, 18LS, and 18RS whose cut-off frequency fc is about 100 Hz. Audio signals of Cch, LSch, and RSch are supplied to first coefficient multipliers 19C, 19LS, and 19RS which are a part of a low frequency signal components synthesizer 20. After the audio signals are multiplied by the multiplication coefficient a ($0<a<1$), they are input to a first adder 20A. Digital audio signals of LFE are also input to the first adder 20A after they are multiplied by the multiplication coefficient a by a second coefficient multiplier 19LF. A value of the coefficient a is equivalent to a value derived by inverting the number $(m+1)$ of coefficient multipliers connected to input terminals of the first adder 20A. The first adder 20A then adds attenuated audio signals of Cch, LSch, RSch, and LFE.

The LPF 21 allows only low frequency signal components of the synthetic audio signals output from the adder 20A to pass. A limiter 24 and a fourth coefficient multiplier 28 receive the low frequency synthetic audio signals output from the LPF 21. Digital audio signals of Lch and Rch are input to the respective third coefficient multipliers 27L and 27R. Since the total number of input channels is $n+1=6$, a multiplication coefficient c for the third coefficient multipliers 27L and 27R are respectively set to 1/6, and a multiplication coefficient d for the fourth coefficient multiplier 28 is set to $4\alpha/6$.

A second adder 25L adds the output of the fourth coefficient multiplier 28 and the output of the third coefficient multiplier 27L, and the second adder 25R adds the output of the fourth coefficient multiplier 28 and the output of the third coefficient multiplier 27R. A result of the addition in the second adder 25L and the second adder 25R are supplied to a limiter setting circuit 26. The limiter setting circuit 26 considers the outputs of second adders 25L and 25R as estimated synthetic signals, and determines a limit level of the limiter 24 when at least one of the two estimated synthetic signals exceeds a specified level. As a result, limiter setting circuit 26 supplies an amplitude limit signal for attenuating input signals to the limiter 24.

A fifth coefficient multiplier 23 is a circuit for amplifying the digital low frequency synthetic audio signals output from the limiter 24 by the multiplication coefficient b. Here, the multiplication coefficient b is equivalent to 1/a, which is 4 in this case. This is due to the inverse relationship between the multiplication coefficient a of the first coefficient multipliers 19C, 19LS, and 19RS, and the second coefficient multiplier 19LF. In other words, the fifth coefficient multiplier 23 amplifies signals attenuated by the first coefficient multipliers 19C, 19LS, and 19RS, and the second coefficient multiplier 19LF to their original level. Low frequency synthetic audio signals output from the fifth coefficient multiplier 23 are distributed to Lch and Rch by the third adders 22L and 22R.

In the first adder 20A, overflow may occur when signals of four channels are added. For this reason, the multiplication coefficient a for the first coefficient multipliers 19C, 19LS, and 19RS, and the second coefficient multiplier 19LF is set to reduce each signal level to ¼ or below. In order to restore the signal levels reduced by these coefficient multipliers to their original level, the fifth coefficient multiplier 23 amplifies the input signals. In this exemplary embodiment, filtered low frequency signal components are distributed to two channels of Lch and Rch. In consideration of the additional acoustic spatial effect after the audio signals are output from speakers as sound, the fifth coefficient multiplier 23 amplifies input signals by 4 $\alpha$. A value of the acoustic spatial addition correction factor $\alpha$ is the same as in the first exemplary embodiment shown in FIG. 1.

The third coefficient multipliers 27L and 27R attenuate the input signals to 1/6, and the fourth coefficient multiplier 28 attenuates the input signals to (4 $\alpha$)/6. If the maximum output level of the LPF 21 is LF, the maximum signal level of Lch is L, and the maximum signal level of Rch is R, the limiter setting circuit 26 outputs the amplitude limit signal which does not limit the signal level to the limiter 24 when an input value to the limiter setting circuit 26 does not exceed (4$\alpha$/6LF+1/6L) or (4$\alpha$/6LF+1/6R). When a value of the estimated synthetic signals input to the limiter setting circuit 26 exceeds (4$\alpha$/6LF+1/6L) or (4$\alpha$/6LF+1/6R), the limiter setting circuit 26 outputs the amplitude limit signal to the limiter 24 to restrict the signal level to values which do not exceed the MSB of the digital circuit system.

With the above control, the results of addition in the third adders 22L and 22R will remain at a signal level which avoids overflow in the digital circuit system. Accordingly, the limiter setting circuit 26 determines a limit level of the limiter 24 based on the maximum signal level of the input audio signals.

For example, consider the case where circuits downstream from the third adders 22L and 22R do not have a surplus amplitude margin when compared to circuits before the adders 22L and 22R. If the output of the third adder 22L or 22R when the limiter 24 does not restrict the signal level is ADD, 1/6 of the signal level of ADD is input to the limiter setting circuit 26. Consequently, whether the output of the third adders 22L and 22R will cause overflow can be determined by monitoring this signal with the limiter setting circuit 26.

When the output of the third adders 22L and 22R are determined to cause overflow based on the monitoring of the maximum signal input to the limiter setting circuit 26, the limiter setting circuit 26 restricts low frequency signal components to be input to the third adders 22L and 22R using the limiter 24.

Signals corresponding to the output of the third adders 22L and 22R are monitored in this way for setting a limit level to the limiter 24. If overflow is unlikely to occur in the third adders 22L and 22R because signal levels of the channels receiving distributed low frequency signal components are low, the limiter 24 is controlled so as not to restrict levels of the distributed low frequency signal components. This assures that the volume of the low frequency signal components of the entire audio signals are properly reproduced. If signal levels of channels receiving distributed low frequency signal components are so high as to cause overflow when receiving distributed low frequency signal components, the limiter 24 is controlled to restrict the level of the low frequency signal components to avoid overflow in the third adders 22L and 22R.

The sound processing circuit of this exemplary embodiment is equipped with a limiter setting circuit to prepare for the case when circuits downstream from the third adders 22L and 22R do not have a surplus amplitude margin against circuits before third adders 22L and 22R, such as the case of the sound processing circuit in the first exemplary embodiment. Therefore, there is no need for securing a surplus amplitude margin in the circuits downstream from the third adders 22L and 22R. This avoids overflow in the third adders 22L and 22R even if the entire circuit is configured in a digital system. Accordingly, degradation of the sound quality, due to dropping of lower bits for securing surplus amplitude margin, can be prevented.

If there is no surplus amplitude margin in the equipment, such as an amplifier connected to later processes in the sound processing circuit, the limiter setting circuit 26 can be set to conform with an amplitude margin of the downstream equipment. This avoids signal overflow in the downstream equipment.

This sound processing circuit may be configured with analog circuits only for the third adders 22L and 22R, for distributing and adding low frequency signal components, as in the first exemplary embodiment, and others with digital circuits. It can also be configured with all analog circuits or all digital circuits. Therefore, configuration of the circuit is not limited to the above exemplary embodiment.

If low frequency signal components are distributed from m independent channels to n-m independent channels, when there are n numbers of independent channels in total, values of multiplication coefficients a, b, c, and d are set as follows. In the following, $\alpha$ is the acoustic spatial addition correction factor.

$$a=1/(m+1),$$

$$b=\alpha(m+1),$$

$$c=1/(n+1),$$

and $$d=\alpha(m+1)/(n+1)$$

Fourth exemplary embodiment

Figure 4:
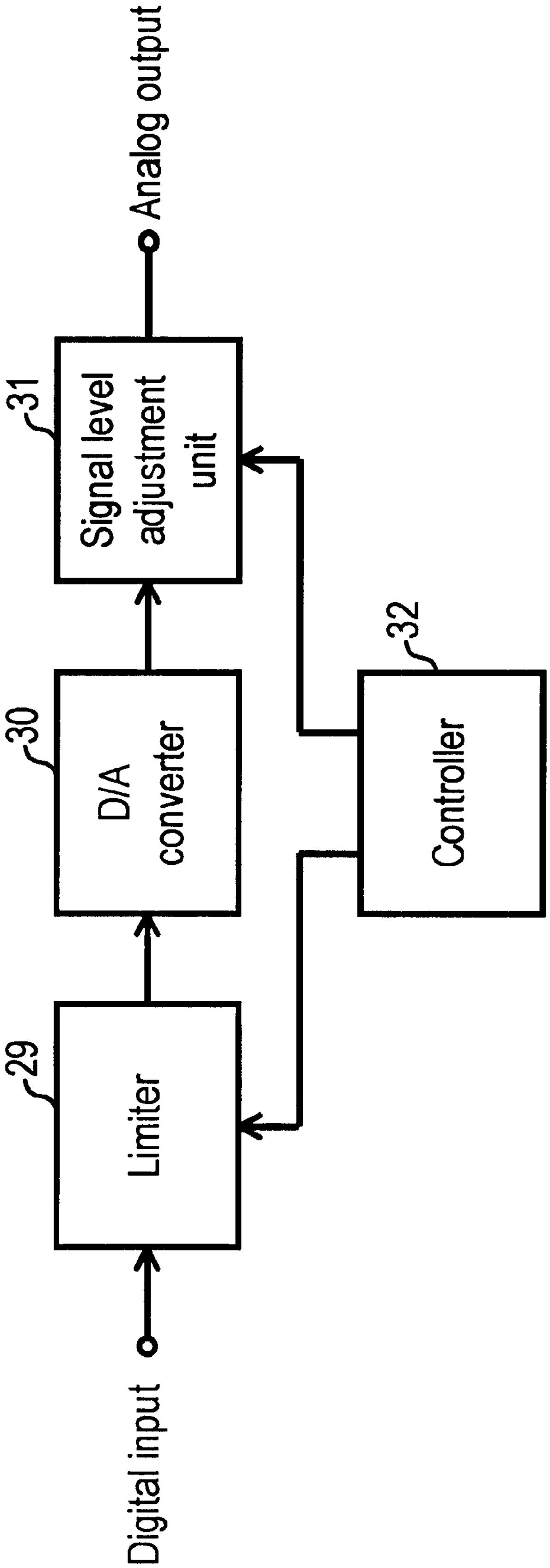
FIG. 4 is a block diagram illustrating a configuration of a portion of a sound processing circuit in accordance with a fourth exemplary embodiment of the present invention.

A sound processing circuit in a fourth exemplary embodiment of the present invention is explained with reference to FIGS. 4–6. First, a low frequency synthetic signal controller is explained. FIG. 4 shows a block diagram of the low frequency synthetic signal controller used in the exemplary sound processing circuit. The low frequency synthetic signal controller shown in FIG. 4 is preferably provided after the low frequency signal component synthesizer previously mentioned.

In FIG. 4, a limiter 29 receives input digital audio signals. The limiter 29 is a circuit for attenuating input signals to restrict an upper level of the input signals based on the amplitude control signal output from a controller 32. The output signal of the limiter 29 is converted to analog audio signals by a D/A converter 30. A signal level adjustment unit 31 is a circuit for attenuating input analog audio signals using the level adjustment signal output from the controller 32. This is equivalent to a function of a volume control in conventional AV equipment.

The controller 32 is a circuit for setting a control level of the limiter 29 associated with a attenuation level of the signal level adjustment unit 31 such that the maximum output signal of the signal level adjustment unit 31 becomes constant at any attenuation level of the signal level adjustment unit 31.

For example, if the attenuation level of the signal level adjustment unit 31 is set to 0 dB, the limiter 29 sets its control level to 6 dB less than the maximum level of the input signals so that the maximum level of the analog audio signal output from the signal level adjustment unit becomes less than a predetermined value of A volts. If the attenuation level of the signal level adjustment unit 31 is set to −3 dB under this condition, the maximum analog signal level to be output from the signal level adjustment unit 31 becomes 3 dB less than A volts if audio signals with the maximum level are input to the limiter 29.

Therefore, the controller 32 resets the control level of the limiter 29 from −6 dB to −3 dB which is equivalent to reducing the attenuation level by 3 dB in the signal level adjustment unit 31. This function maintains the maximum level of analog signals output from the signal level adjustment unit 31 to A volts, and the attenuation level of the signal level adjustment unit 31 remains at the same level as before the change.

Figure 5:
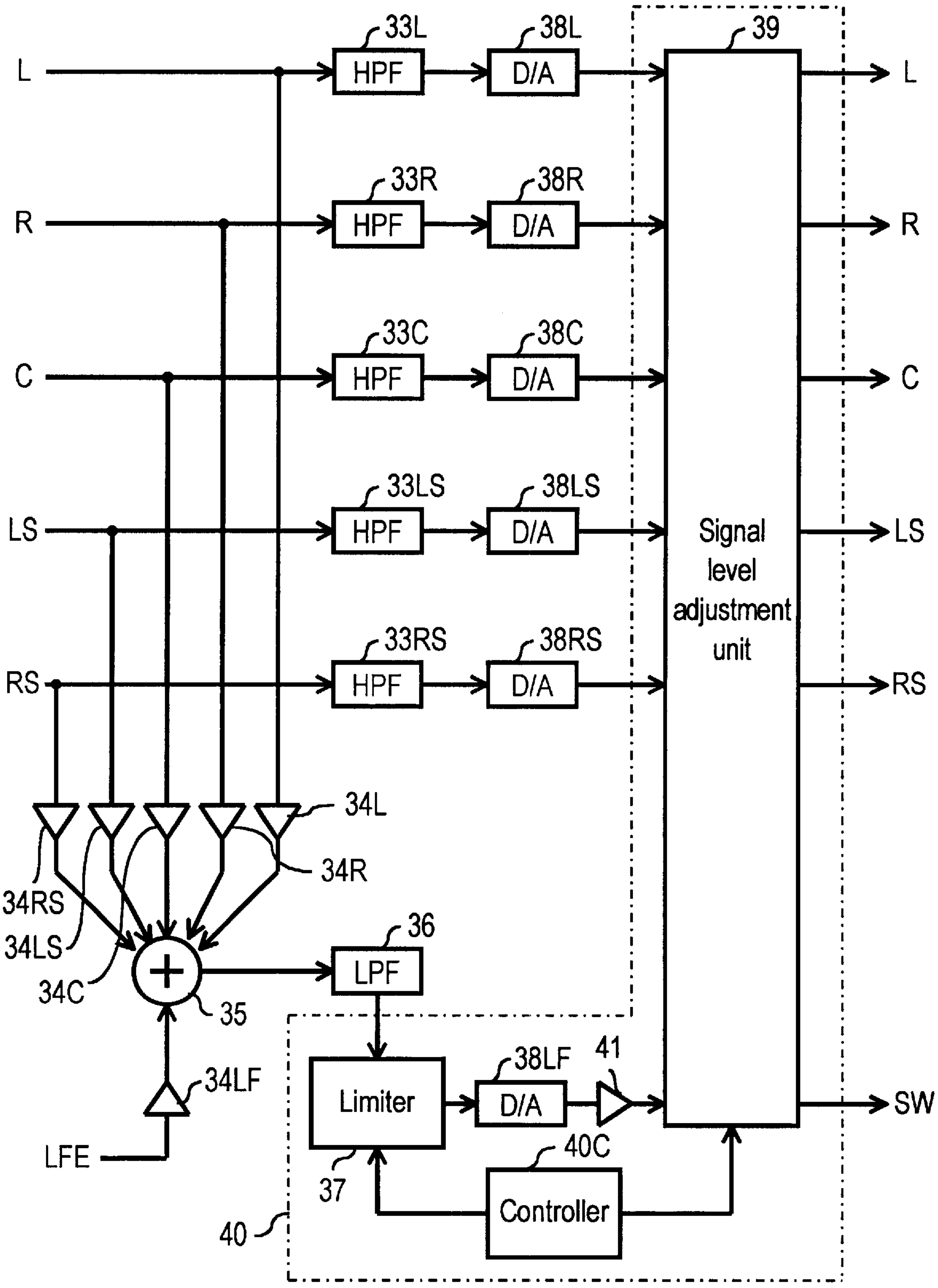
FIG. 5 is a block diagram of a configuration of a fourth exemplary embodiment of the present invention.

FIG. 5 shows an entire configuration of a sound processing circuit of this exemplary embodiment including the low frequency synthetic signal controller. The difference between this exemplary embodiment and the aforementioned exemplary embodiments is that a low frequency signal channel (hereafter referred to as SWch) is provided to an output unit in addition to the digital audio signals of the six channels Lch, Rch, Cch, LSch, RSch, and LFE.

In FIG. 5, digital audio signals of five channels: Lch, Rch, Cch, LSch, and RSch are respectively input to HPFs 33L, 33R, 33C, 33LS, and 33RS to cut off the low frequency signal components. Audio signals of the middle and high frequency components are supplied to first D/A converters 38L, 38R, 38C, 38LS, and 38RS for conversion into analog audio signals. The analog audio signals of each of these channels are output through the signal level adjustment unit 39 which is a part of the low frequency synthetic signal controller 40.

Audio signals of the six channels Lch, Rch, Cch, LSch, RSch, and LFE are also supplied to respective first coefficient multipliers 34L, 34R, 34C, 34LS, and 34RS, and the second coefficient multiplier 34L, for attenuation by the multiplication coefficient a to a valve of 1/6 the respective input value. The attenuated audio signals of the six channels are then added by the first adder 35.

A LPF 36 receives the output of the first adder 35 and allows only the low frequency signal components to pass. The filtered low frequency audio signals are input to the low frequency synthetic signal controller 40. The low frequency synthetic signal controller 40 comprises a limiter 37, second D/A converter 38LF, third coefficient multiplier 41, signal level adjustment unit 39, and controller 40C. Low frequency synthetic audio signals output from the LPF 36 are input to the limiter 37 (shown as element 29 in FIG. 4), and the limiter 37 converts these signals into digital audio signals with upper restrictions if the input signals exceed the maximum level. The converted signals are input to the second D/A converter 38LF (shown as element 30 in FIG. 4), and converted into analog audio signals. Then, these analog audio signals are amplified by the third coefficient multiplier 41, which uses, for example, the value 6 as the multiplication coefficient e, and supplies amplified signals to the signal level adjustment unit 39 (shown as element 31 in FIG. 4). If the controller 40C (shown as element 32 in FIG. 4) is configured with a remote control, the attenuation level of the signal level adjustment unit 39 is set based on operation by the user. The signal level adjustment unit 39 attenuates the level of all channels in the same way. The limiter 37, second D/A converter 38LF, signal level adjustment unit 39, and controller 40C in FIG. 5 are equivalent as those shown in FIG. 4, and therefore explanation of their function is not repeated.

As shown in FIG. 5, audio signals from the six channels are output to SWch. Accordingly, if signals with the maximum amplitude in the same phase within a filtered band of the LPF 36 are input to all channels as input signals, amplitude of the output signal of SWch reaches 6 times the input signal level if the attenuation level in the signal level adjustment unit 39 is 0 dB. For example, if the amplitude of the input signal is 2 Vrms, the amplitude of the output signal of SWch becomes 12 Vrms.

Thus, the amplitude of SWch may reach a value 6 times the maximum compared to other channels, and abnormal sound, such as a clipping sound, may occur due to overflow in the downstream equipment if this output is supplied unaltered to following processes. To avoid abnormal sound, it is necessary to restrict the amplitude to a level which will not cause overflow in the downstream equipment.

For example, in the sound processing circuit in FIG. 5, if the maximum amplitude of the input audio signal is 2 Vrms, for example, and the maximum amplitude of the audio signals to be output from Swch is also restricted also to 2 Vrms. If audio signals with the same phase and the maximum amplitude, which is 2 Vrms, is input to all channels as the input signals, the output amplitude of SWch will reach 6 times of 2 Vrms, or 12 Vrms, if a limit level of the limiter 37 is sufficiently high and the attenuation level of the signal level adjustment unit 39 is 0 dB. Accordingly, it is necessary to attenuate the signal by about 16 dB in order to limit the level of output audio signals to 2 Vrms.

Thus, the controller 40C thus sets a control level of the limiter 37 to −16 dB from the maximum amplitude level when the attenuation level of the signal level adjustment unit 39 is 0 dB. When the attenuation level of the signal level adjustment unit 39 is set to −xdB, however, the attenuation required for limiting the level to 2 Vrms become (16−x) dB, because the maximum amplitude of SWch will be lower than 12 Vrms by −xdB. If (16−x) is larger than 0, the controller 40C sets the control level of the limiter 37 to (16−x) dB less than the maximum amplitude level. If (16−x) is less than 0, the controller 40C sets the control level of the limiter 3 to the maximum amplitude level, which means the limiter 37 will not function as a limiter.

As explained above, the controller 40C sets the control level of the limiter 37 in accordance with the attenuation level of the signal level adjustment unit 39 so as to maintain a constant maximum amplitude level of the output signal of SWch regardless of the attenuation level set by the signal level adjustment unit 39. Accordingly, the controller 40C avoids unnecessary restriction of the output level when the attenuation level of the signal level adjustment unit 39 is large.

In FIG. 5, a high-pass filter 33L, 33R, 33C, 33LS, and 33RS is provided to m=5 numbers of channels out of the n=5 numbers of independent channels, i.e., Lch, Rch, Cch, LSch, and RSch. However, as shown in FIG. 1, it is possible to configure the circuit without providing a high-pass filter to the L and R channels. In this case, there is no need for HPFs 33L and 33R, and n−m becomes 2. The D/A converters 38L and 38R also become a third D/A converter. The multiplication coefficient a for the first and second coefficient multipliers may also be changed in accordance with the number of channels to which the high-pass filter is provided.

Another configuration of the sound processing circuit of the fourth exemplary embodiment of the present invention is explained next. In the configuration of the sound processing circuit shown in FIG. 5, the first coefficient multipliers 34L, 34R, 34C, 34LS, and 34RS, and the second coefficient multiplier 34LF attenuates input signals to the level which does not cause overflow, in order to prevent overflow of low frequency signals in the digital unit. The third coefficient multiplier 41, in the analog unit, then re-establishes these attenuated signals to their original levels. Here, if the S/N ratios of the first D/A converters 38L to 38RS are low, noise will be amplified by the third coefficient multiplier 41, in the analog unit, resulting in deterioration of the SIN ratios. If these audio signals are distributed to other channels, the S/N ratios of channels receiving signals with slightly lower S/N ratios may not noticeably deteriorate because signals which originally exist in these channels are dominant. However, if these low frequency audio signals are not distributed, and output from SWch as independent signals as shown in FIG. 5, there may be some inconvenience.

Figure 6:
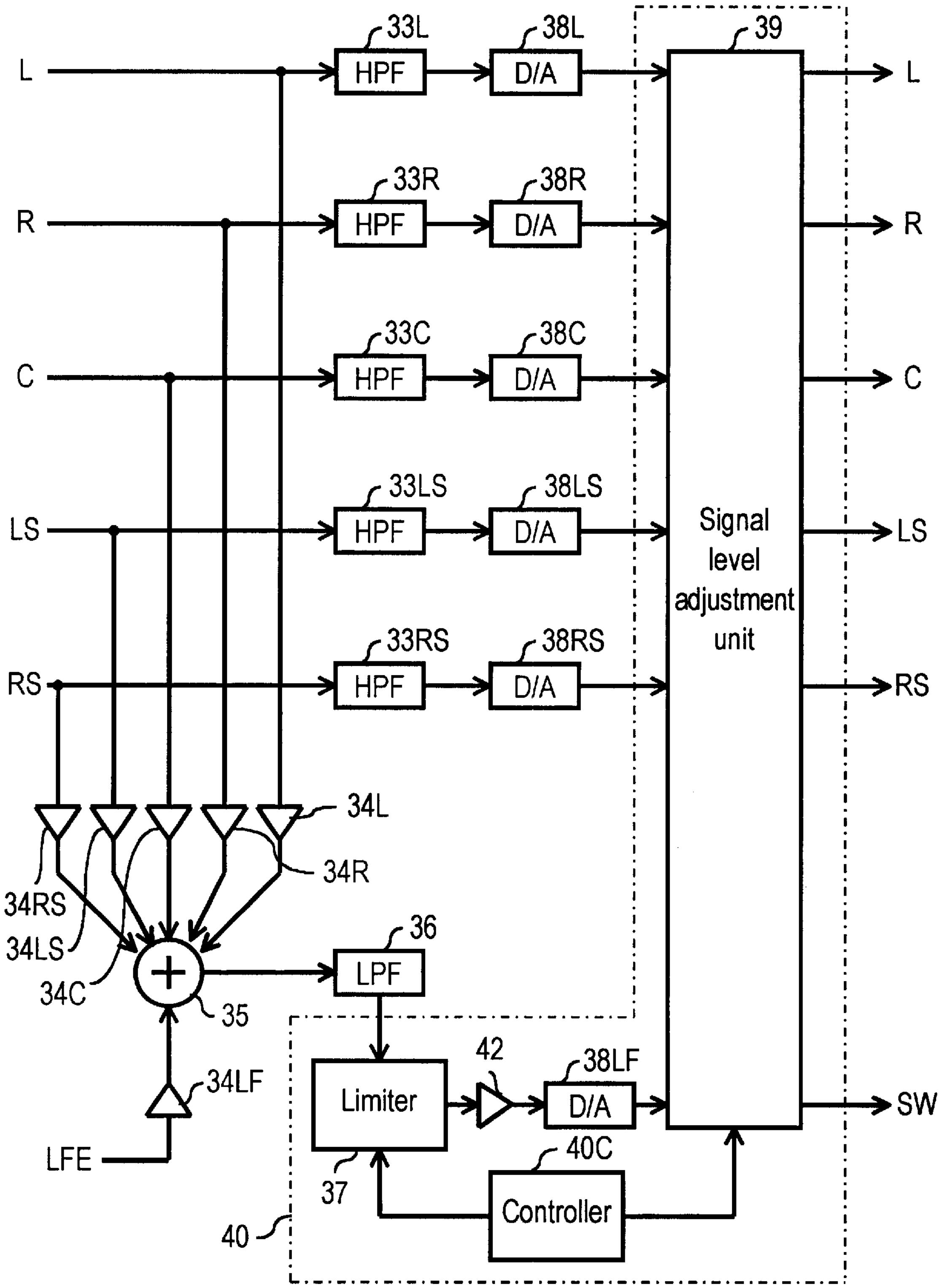
FIG. 6 is a block diagram of another configuration of the fourth exemplary embodiment of the present invention.
Figure 7:
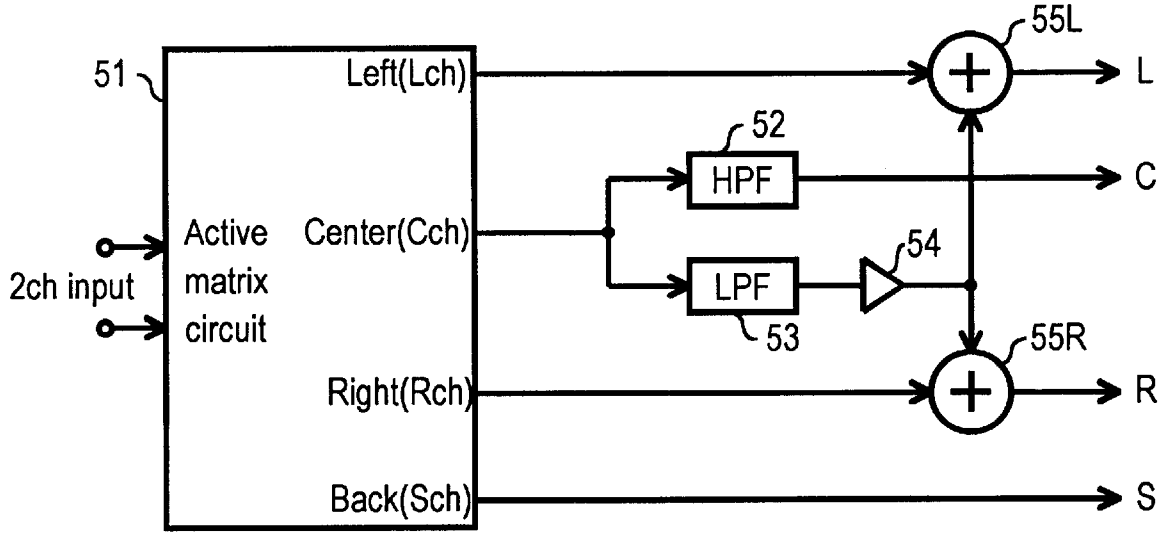
FIG. 7 PRIOR ART
FIG. 7 is a block diagram of a configuration of a conventional sound processing circuit employing an active matrix circuit.

To prevent this problem, the sound processing circuit of this exemplary embodiment may be modified to a configuration shown in FIG. 6, instead of that in FIG. 5. As shown in FIG. 6, one of the characteristics of this sound processing circuit is provision of a third coefficient multiplier 42 before the second D/A converter 38LF. The balance of the configuration is the same as in FIG. 5. The same element numbers are used for the other circuits and, thus, explanation of these elements and their operation is not repeated.

In the sound processing circuit shown in FIG. 5, the first coefficient multipliers 34L, 34R, 34C, 34LS, and 34RS, and the second coefficient multiplier 34LF attenuate audio signals of each channel and the third coefficient multiplier 41 in the analog unit restores them to their original level. In the sound processing circuit shown in FIG. 6, however, audio signals attenuated in the first coefficient multipliers 34L, 34R, 34C, 34LS, and 34RS, and the second coefficient multiplier 34LP are restored to their original level in the third coefficient multiplier 42 in the digital unit.

With this configuration, low frequency signals which are attenuated and filtered in the first coefficient multipliers 34L to 34RS and the second coefficient multiplier 34LF are restored to their original signal level before the second D/A converter 34LF. Accordingly, signals with sufficient numbers of bits can be supplied to the second D/A converter 38LF for improving the S/N ratio after converting them to analog signals. However, it is necessary to set a limit level to the limiter 37 to prevent overflow in the digital unit when restoring low-band synthetic audio signals to their original level in the third coefficient multiplier 42. For example, in the configuration shown in FIG. 6, a multiplication coefficient for the third coefficient multiplier 42 is set to multiply signals by a factor of 6. The limiter 37 is therefore set to restrict the amplitude of audio signals input to the limiter 37 to 1/6 or below.

The sound processing circuit shown in FIG. 4 is not only effective for restricting the output of audio signals from SWch, such as that shown in FIGS. 5 and 6, but also effective for distributing low frequency signal components to other channels, such as in the first exemplary embodiment shown in FIG. 1. Therefore, the configuration of the sound processing circuit of the present invention is not limited to the above exemplary embodiment.

Sound processing circuits corresponding to the discrete digital multichannel system are explained in all exemplary embodiments of the present invention. However, the present invention is similarly applicable to other multichannel audio signal recording and reproduction systems such as MPEG, without being limited to the discrete digital multichannel system.

Values for the multiplication coefficient and cut-off frequency, and channels to apply the low frequency signal components are exemplary examples, and not restricted thereto.

The preferred embodiments described herein are therefore illustrative and not restrictive. The scope of the invention being indicated by the appended claims and all modifications which come within the true spirit of the claims are intended to be embraced therein.

What is claimed is:

1. A sound processing circuit for filtering low frequency signal components of audio signals in a plurality of channels based upon low frequency digital audio signals of a low frequency channel and a plurality of independent multiple channels, said circuit comprising:

a plurality of high-pass filters for receiving and filtering a first plurality of said digital audio signals of said plurality of independent multiple channels and producing a plurality of filtered output signals;

a plurality of first coefficient multipliers for receiving and multiplying respective ones of said first plurality of digital audio signals;

a second coefficient multiplier for receiving and multiplying said low frequency signals of low frequency channel, and an adder for adding an output of each of said plurality of first coefficient multipliers and an output of said second coefficient multiplier to produce a synthetic audio signal.

2. A sound processing circuit for filtering low frequency signal components of digital audio signals in a plurality of specified channels based upon low frequency signals of a low frequency channel and a plurality of independent channels, and distributing said low frequency signal components to at least one further channel, said circuit comprising:

a plurality of high-pass filters for receiving and filtering respective ones of said digital audio signals of said plurality of specified channels, and producing a plurality of filtered output signals;

a plurality of first coefficient multipliers for receiving and multiplying said respective ones of said digital audio signals of said plurality of specified channels by multiplication coefficients $a_i$;

a second coefficient multiplier for receiving and multiplying said low frequency signals of said low frequency channel by a multiplication coefficient aL;

a first adder for adding an output of each of said plurality of first coefficient multipliers and an output of said second coefficient multiplier to produce a synthetic audio signal;

a low pass filter for receiving said synthetic audio signal from said first adder, and producing an output having components below a predetermined cut-off frequency fc;

at least one first digital-to-analog converter for converting digital audio signals of said at least one further channel not connected to said plurality of high-pass filters into at least one first analog audio signal;

a plurality of second digital-to analog converters for converting said plurality of filtered output signals of said plurality of high-pass filters into a plurality of analog audio signals;

a third digital-to-analog converter for converting the output of said low-pass filter into a further analog audio signal;

a third coefficient multiplier for multiplying said further analog audio signal of said third digital-to-analog converter by a multiplication coefficient b and producing a multiplied output signal; and at least one second adder for adding the multiplied output signal of said third coefficient multiplier and said at least one first analog audio signal of said at least one first digital-to-analog converter.

3. A sound processing circuit for filtering low frequency signal components of digital audio signals in a plurality of specified channels based upon a low frequency signal of a low frequency channel and a plurality of independent channels, and distributing said low frequency signal components to at least one further channel, said circuit comprising:

a plurality of high-pass filters for receiving and filtering respective ones of said digital audio signals of said plurality of independent channels, and producing a plurality of filtered output signals;

a plurality of switches for selecting one of a respective one of i) said digital audio input signals and ii) said plurality of filtered output signals of said plurality of high-pass filters and producing a plurality of switched signals;

a plurality of first coefficient multipliers for receiving and multiplying said plurality of audio input signals of said plurality channels by multiplication coefficents $a_i$;

a second coefficient multiplier for receiving and multiplying said low frequency signals of said low frequency channel by a multiplication coefficient aL;

a first adder for adding an output of each of said plurality of first coefficient multipliers and an output of said second coefficient multiplier to produce a synthetic audio signal;

a low pass filter for receiving said synthetic audio signal from said first adder, and producing an output having components below a predetermined cut-off frequency fc;

a plurality of first digital-to-analog converters for converting said plurality of switched signals output from said plurality of switches into a plurality of analog audio signals;

a second digital-to-analog converter for converting the output of said low-pass filter into a further analog audio signal;

a third coefficient multiplier for multiplying said further analog audio signal from said second digital-to-analog converter by a multiplication coefficient b and producing a multiplied output signal;

a plurality of selectors for selectively coupling the multiplied output signal of said third coefficient multiplier and the plurality of analog audio signals output from said plurality of first digital-to-analog converters to a plurality of second adders; and said plurality of second adders for adding the multiplied output signal of said third coefficient multiplier and the plurality of analog audio signals output of said plurality of first digital-to-analog converters responsive to the selection made by said plurality of selectors.

4. A sound processing circuit as defined in claim 3, wherein said plurality of high-pass filters, said plurality of switches, said plurality of selectors, and said plurality of second adders, for a predetermined one of said plurality of independent channels, are considered respectively as an $i^{th}$ high-pass filter, an $i^{th}$ switch, an $i^{th}$ selector, and an $i^{th}$ second adder; and said i selector is controlled to supply the output of said third coefficient multiplier to said $i^{th}$ second adder if said $i^{th}$ switch is not selecting the output signal of said $i^{th}$ high-pass filter.

5. A sound processing circuit as defined in claim 2, wherein said multiplication coefficient $a_i$ for said first coefficient multipliers and the multiplication coefficient aL for said second coefficient multiplier are based on a count of said plurality of specified channels.

6. A sound processing circuit as defined in claim 2, wherein said multiplication coefficient b for the third coefficient multiplier is 1 greater than a count of said plurality of specified channels.

7. A sound processing circuit as defined in claim 2, wherein said multiplication coefficient b of the third coefficient multiplier is at least $\alpha$, where $\alpha$ is an acoustic spatial addition correction factor.

8. A sound processing circuit for filtering low frequency signal components of digital audio signals in a plurality of specified channels based upon low frequency signals of a low frequency channel and a plurality of independent channels, and distributing said low frequency signal components to at least one further channel, said circuit comprising:

a plurality of high-pass filters for receiving and filtering respective ones of said digital audio signals of said plurality of specified channels, and producing a plurality of filtered output signals;

a plurality of first coefficient multipliers for receiving and multiplying said respective ones of said digital audio signals of said plurality of specified channels by a multiplication coefficients $a_i$;

a second coefficient multiplier for receiving and multiplying said low frequency signals of said low frequency channel by a multiplication coefficient aL;

a first adder for adding an output of each of said plurality of first coefficient multipliers and an output of said second coefficient multiplier to produce a synthetic audio signal;

a low-pass filter for receiving said synthetic audio signal from said first adder, and producing a filtered synthetic audio output signal having components below a predetermined cut-off frequency fc;

at least one third coefficient multiplier for multiplying digital audio signals of said at least one further channel not connected to said plurality of high-pass filters by a multiplication coefficient c;

a fourth coefficient multiplier for receiving and multiplying the filtered synthetic audio output signal from said low-pass filter by a multiplication coefficient d;

at least one second adder for adding the output of said at least one third coefficient multiplier and the output of said fourth coefficient multiplier to produce a plurality estimated synthetic audio signals;

a limiter setting circuit for detecting a maximum level of one of said estimated synthetic audio signals from said plurality of estimated synthetic audio signals output from said at least one second adder, and producing an amplitude control signal in accordance with the detected maximum level;

a limiter to receive said filtered synthetic audio signal from said low-pass filter and control an amplitude of said plurality of synthetic audio signals based on the amplitude control signal received from said limiter setting circuit and producing amplitude controlled audio signals;

a fifth coefficient multiplier for multiplying said amplitude controlled audio signals of said limiter by a multiplication coefficient b and producing an output signal; and at least one third adder for adding the output signal of said fifth coefficient multiplier and the digital audio signals of said at lest one further channel not connected to said plurality of high-pass filters.

9. A sound processing circuit as defined in claim 8, wherein said multiplication coefficients a ($a_i$ and aL) and b are based on a number of said plurality of specified channels, said multiplication coefficient c is based on a number of said plurality of independent channels, and said multiplication coefficient d is based on the number of said plurality of specified channels, the number of said plurality of independent channels, and α, where α is an acoustic spatial addition correction factor.

10. A sound processing circuit for filtering low frequency signal components of audio signals in a plurality of specified channels based upon low frequency digital audio signals of a low frequency channel and a plurality of independent multiple channels, and outputting a filtered low frequency signal component, said circuit comprising:

a plurality of high-pass filters for receiving and filtering respective ones of said digital audio signals of said plurality of specified channels and producing a plurality of filtered output signals;

a plurality of first coefficient multipliers for receiving and multiplying said respective ones of said digital audio signals of said plurality of specified channels;

a second coefficient multiplier for receiving and multiplying said low frequency signal of said low frequency channel;

an adder for adding an output of each of said plurality of first coefficient multipliers and an output of said second coefficient multiplier to produce a synthetic audio signal;

a low-pass filter for receiving said synthetic audio signal from said first adder, and producing an output signal having components below a predetermined cut-off frequency fc;

a plurality of first digital-to-analog converters for converting said plurality of filtered output signals output from said plurality of high-pass filters into a plurality of analog signals;

a limiter to limit a maximum output level of said low-pass filter to below a predetermined level in accordance with an amplitude control signal;

a second digital-to-analog converter for converting digital audio signals output from said limiter into analog signals;

a third coefficient multiplier to receive and multiply said analog audio signals of said second digital-to-analog converter by a multiplication coefficient e;

a signal level adjustment unit to receive analog audio signals from said plurality of first digital-to-analog converters and said second digital-to-analog converter, and adjust a signal level of the received audio signal in accordance with a level adjustment signal; and a controller for supplying said level adjustment signal to said signal level adjustment unit and supplying said amplitude control signal to said limiter in accordance with a level of said level adjustment signal.

11. A sound processing circuit for filtering low frequency signal components of audio signals in a plurality of specified channels based upon low frequency digital audio signals of a low frequency channel and a plurality of independent multiple channels, and outputting a filtered low frequency signal component, said circuit comprising:

a plurality of high-pass filters for receiving and filtering respective ones of said digital audio signals of said plurality of specified channels and producing a plurality of filtered output signals;

a plurality of first coefficient multipliers for receiving and multiplying said respective ones of said digital audio signals of said plurality of specified channels;

a second coefficient multiplier for receiving and multiplying said low frequency signal of said low frequency channel;

an adder for adding an output of each of said plurality of first coefficient multipliers and an output of said second coefficient multiplier to produce a synthetic audio signal;

a low-pass filter for receiving said synthetic audio signal from said adder, and producing an output signal having components below a predetermined cut-off frequency fc;

a plurality of first digital-to-analog converters for converting said plurality of filtered output signals output from said plurality of high-pass filters into a plurality of analog audio signals;

a limiter to limit a maximum output level of said low-pass filter to below a predetermined level in accordance with an amplitude control signal;

a third coefficient multiplier to receive and multiply said digital audio signals output from said limiter by a multiplication coefficient e;

a second digital-to-analog converter for converting digital audio signals output from said third coefficient multiplier into analog audio signals;

a signal level adjustment unit to receive analog audio signals from said plurality of first digital-to-analog converters and said second digital-to-analog converter, and adjust a signal level of the received audio signals in accordance with a level adjustment signal; and a controller for supplying said level adjustment signal to said signal level adjustment unit and supplying said amplitude control signal to said limiter in accordance with a level of said level adjustment signal.

12. A sound processing circuit as defined claim 10, further comprising at least one third digital-to-analog converters for converting digital audio signals of at least one further channel not connected to said plurality of high-pass filters to analog signals.

13. A sound processing circuit as defined claim 11, further comprising at least one third digital-to-analog converters for converting digital audio signals of at least one further channel not connected to said plurality of high-pass filters to analog signals.

14. A sound processing circuit as defined in claim 2, wherein said multiplication coefficients $a_i$ for said first coefficient multipliers and the multiplication coefficient aL for said second coefficient multiplier are based on a number of said plurality of specified channels.

15. A sound processing circuit as defined in claim 3, wherein said multiplication coefficient $a_i$ for said first coefficient multipliers and the multiplication coefficient aL for said second coefficient multiplier are based on a number of said plurality of specified channels.

16. A sound processing circuit as defined in claim 4, wherein said multiplication coefficient $a_i$ for said first coefficient multipliers and the multiplication coefficient aL for said second coefficient multiplier are based on a number of said plurality of specified channels.

17. A sound processing circuit as defined in claim 3, wherein said multiplication coefficient b for said third coefficient multiplier is 1 greater than a number of said plurality of specified channels.

18. A sound processing circuit as defined in claim 4, wherein said multiplication coefficient b for said third coefficient multiplier is 1 greater than a number of said plurality of specified channels.

19. A sound processing circuit as defined in claim 3, wherein said multiplication coefficient b of said third coefficient multiplier is at least $\alpha$, where $\alpha$ is an acoustic spatial addition correction factor.

20. A sound processing circuit as defined in claim 4, wherein said multiplication coefficient b of said third coefficient multiplier is at least $\alpha$, where $\alpha$ is an acoustic spatial addition correction factor.

21. A sound processing circuit as defined in claim 1, further comprising a low pass filter for receiving said synthetic audio signal from said adder, and producing an output signal.

22. A sound processing circuit as defined in claim 21, wherein said output signal has components below a predetermined cut-off frequency fc.

23. A sound processing circuit as defined in claim 22, wherein said plurality of high pass filters pass signal components having a frequency higher than said cut-off frequency fc.

24. A sound processing circuit as defined in claim 1, wherein said plurality of first coefficient multipliers multiply said digital audio signals of said plurality of channels by a multiplication coefficient $a_i$, where $0<ai<1$.

25. A sound processing circuit as defined in claim 1, wherein second coefficient multiplier multiplies said low frequency signals of said low frequency channel by a multiplication coefficient aL, where $0<aL<1$.

* * * * *

UNITED STATES PATENT AND TRADEMARK OFFICE

CERTIFICATE OF CORRECTION

PATENT NO. : 6,381,333 B1
DATED : April 30, 2002
INVENTOR(S) : Tatsuya Suzuki

It is certified that error appears in the above-identified patent and that said Letters Patent is hereby corrected as shown below:

<u>Column 22,</u>
Line 22, "ai" should be -- $a_i$ --.

Signed and Sealed this

Eleventh Day of February, 2003

JAMES E. ROGAN
*Director of the United States Patent and Trademark Office*